(12) United States Patent
Liaw

(10) Patent No.: US 11,127,819 B2
(45) Date of Patent: Sep. 21, 2021

(54) GATE ALL AROUND TRANSISTORS FOR DIFFERENT APPLICATIONS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/571,264

(22) Filed: Sep. 16, 2019

(65) Prior Publication Data

US 2021/0083054 A1  Mar. 18, 2021

(51) Int. Cl.
| | | |
|---|---|---|
| H01L 29/10 | (2006.01) | |
| H01L 29/78 | (2006.01) | |
| H01L 29/66 | (2006.01) | |
| H01L 29/06 | (2006.01) | |
| H01L 29/423 | (2006.01) | |
| H01L 29/786 | (2006.01) | |

(52) U.S. Cl.
CPC ...... *H01L 29/1037* (2013.01); *H01L 29/0673* (2013.01); *H01L 29/42392* (2013.01); *H01L 29/66795* (2013.01); *H01L 29/785* (2013.01); *H01L 29/78696* (2013.01)

(58) Field of Classification Search
CPC .................................................. H01L 29/42392
See application file for complete search history.

(56) References Cited

U.S. PATENT DOCUMENTS

| | | | |
|---|---|---|---|
| 9,613,953 B2 | 4/2017 | Liaw | |
| 9,793,273 B2 | 10/2017 | Liaw | |
| 9,805,985 B2 | 10/2017 | Liaw | |
| 10,490,559 B1* | 11/2019 | Ando | H01L 29/401 |
| 2017/0194213 A1* | 7/2017 | Ching | H01L 21/823412 |
| 2020/0295127 A1* | 9/2020 | Mannebach | H01L 21/823871 |

* cited by examiner

*Primary Examiner* — Yu-Hsi D Sun
(74) *Attorney, Agent, or Firm* — Haynes and Boone, LLP

(57) ABSTRACT

Semiconductor devices and methods are provided. A semiconductor device according to the present disclosure includes a first gate-all-around (GAA) transistor that includes a plurality of first channel members and a first gate dielectric layer over the plurality of first channel members, and a second GAA transistor that includes a plurality of second channel members, and a second gate dielectric layer over the plurality of second channel members. A first width (W1) of each of the plurality of first channel members is greater than a second width (W2) of each of the plurality of second channel members. A first thickness (GL1) of the first gate dielectric layer is smaller than a second thickness (GL2) of the second gate dielectric layer.

20 Claims, 13 Drawing Sheets

GATE ALL AROUND TRANSISTORS FOR DIFFERENT APPLICATIONS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate stack, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate stack that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

IC devices require different transistor configurations for different applications. For example, transistors for logic devices may require fast speed and high drive current while transistors for memory devices may require low leakage. Although existing GAA transistors and processes are generally adequate for fabricating transistors with different threshold voltages, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
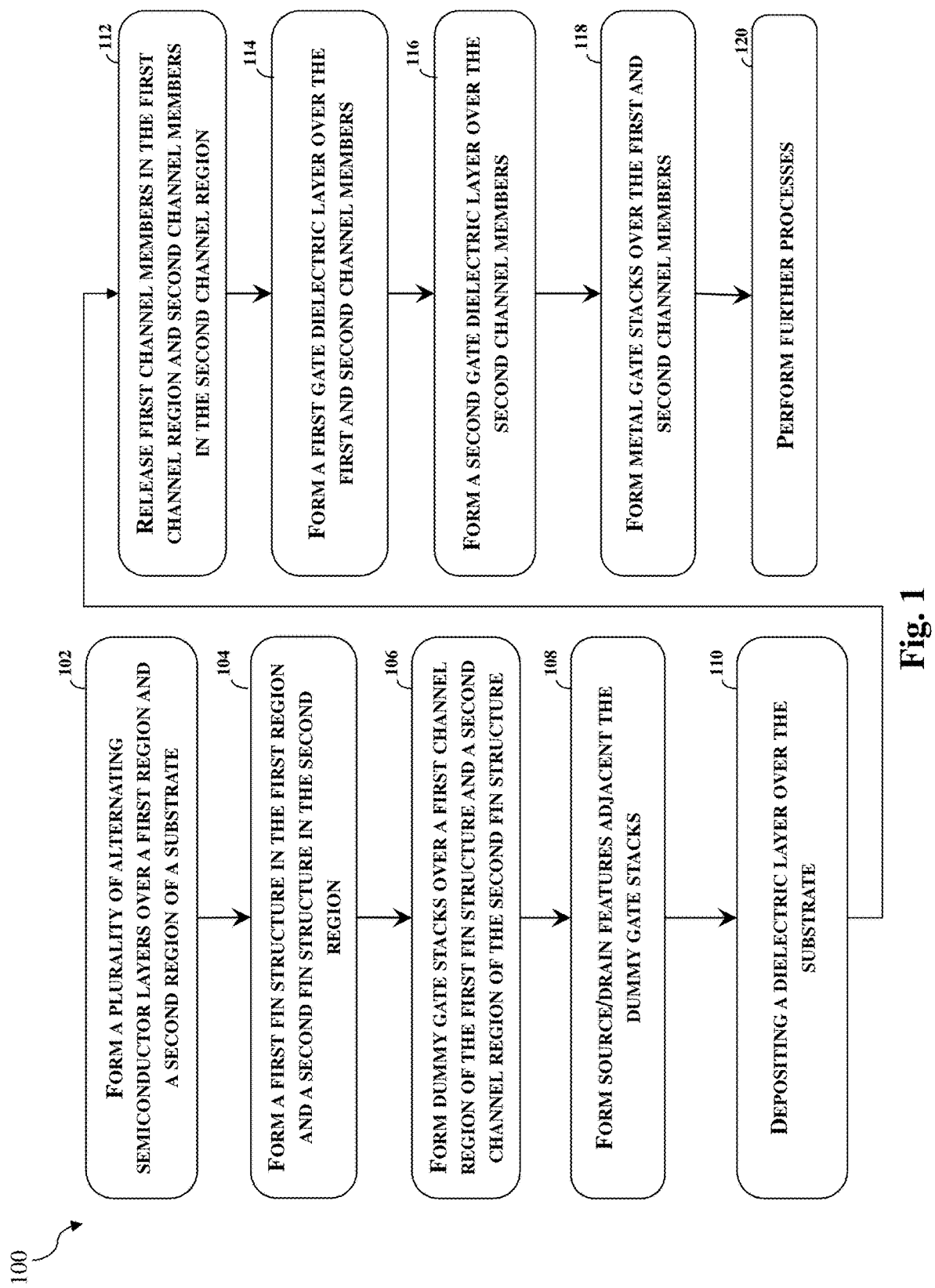
FIG. 1 is a flowchart illustrating a method of forming a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to GAA transistors, and more particularly, to GAA transistors for high speed and low leakage applications. Conventionally, even when both nanowire GAA transistors and nanosheet GAA transistors are formed on a workpiece, the same gate dielectric layer is formed over channel regions of the nanowire GAA transistors and nanosheet GAA transistors. These conventional methods may not result in ideal levels of device differentiation to simultaneously meet requirements for high speed applications and low leakage applications. A semiconductor device according to embodiments of the present disclosure includes a first-type GAA transistor with nanosheet channel members and thin gate dielectric layers and a second-type GAA transistor with nanowire channel members and thick gate dielectric layers. The thin gate dielectric layers enhance performance (in terms of speed and drive current) of the first-type GAA transistor and the thick gate dielectric layers enhance control and reduce power consumption of the second-type GAA transistor. In addition, the different gate dielectric layer thicknesses also provide means to form GAA transistors of different threshold voltages. This is desirable as modern IC devices demand multi-threshold arrangements for balance of power and performance.

FIG. 1 illustrates a flow chart of a method 100 for fabricating a semiconductor device according to various aspects of the present disclosure. FIG. 1 will be described below in conjunction with FIGS. 2-8, 9A, 9B, and 10, which are fragmentary cross-sectional views of a workpiece at various stages of fabrication according to method 100 in FIG. 1 before the semiconductor device is fabricated on the workpiece. Throughout the present disclosure, for the ease of reference, the workpiece and the semiconductor device may be referred to interchangeably as the workpiece is to become the semiconductor device at the conclusion of the processes and may share the same reference numeral. Additional steps can be provided before, during, and after method 100, and some of the steps described can be moved, replaced, or eliminated for additional embodiments of method 100. Additional features can be added in the semiconductor device depicted in FIGS. 2-8, 9A, 9B, and 10 and some of the features described below can be replaced, modified, or eliminated in other embodiments of the semiconductor device.

Figure 2:
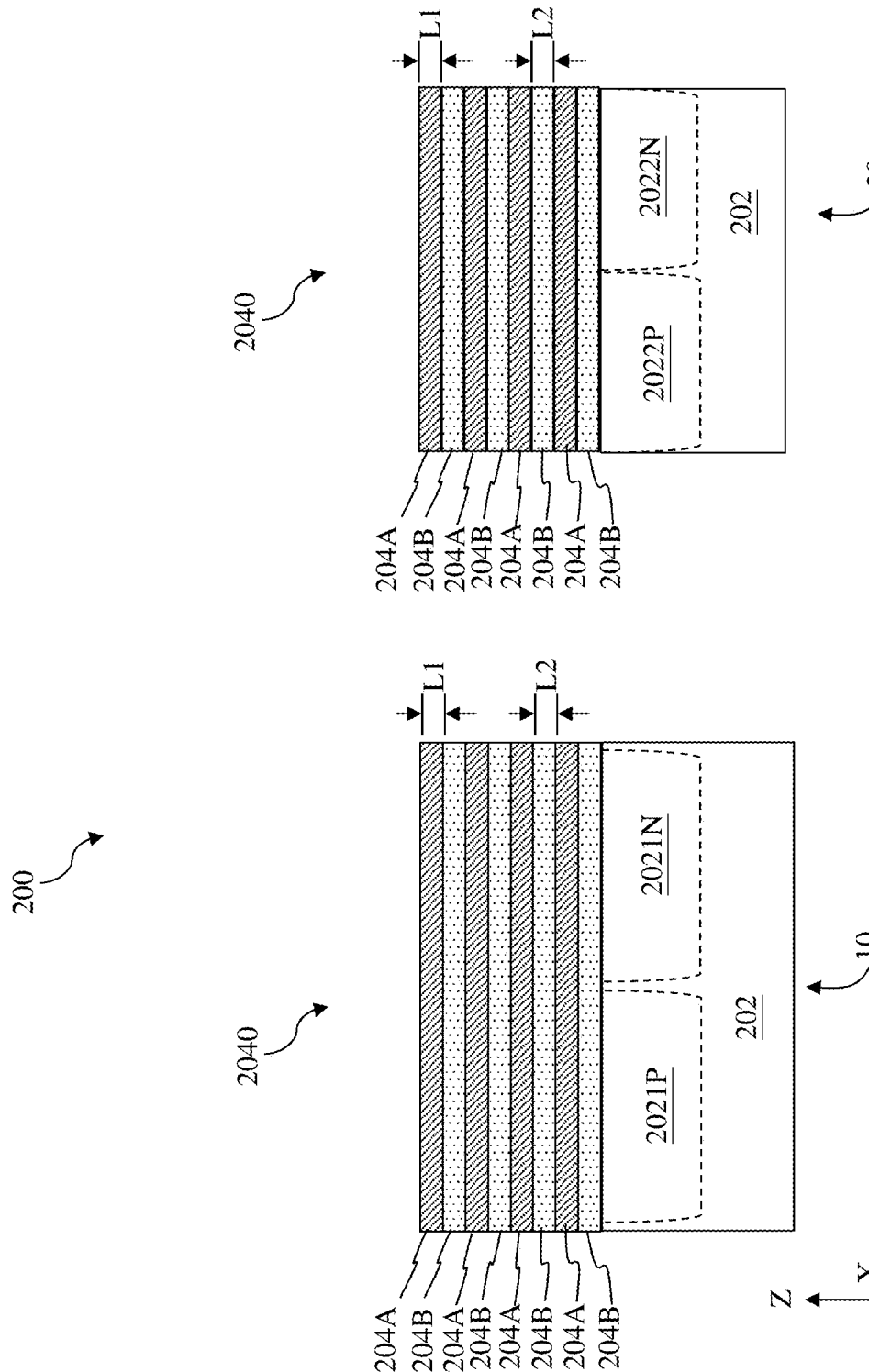
FIGS. 2-8, 9A, 9B, and 10 illustrate fragmentary cross-sectional views of a workpiece at various stages of fabrication, according to various aspects of the present disclosure.

Referring now to FIGS. 1 and 2, the method 100 includes a block 102 where a plurality of alternating semiconductor layers 2040 over a first region 10 and a second region 20 of a substrate 202 in a workpiece 200. In some embodiments, the substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (or wells) configured according to design requirements of semiconductor device 200, such as p-type doped regions (or p-wells) 2021P and 2022P, and n-type doped regions (or n-wells) 2021N and 2022N, or combinations thereof. P-type doped regions, such as 2021P and 2022P, include p-type dopants, such as boron, indium, other p-type dopant, or combinations thereof. N-type doped regions, such as 2021N and 2022N, include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices are formed over n-type wells and n-type GAA devices are formed over p-type wells. Depending on design requirements, the n-well 2021N in the first region 10 may be different from n-well 2022N in the second region 20 in terms of dopants or doping concentrations. Similarly, p-well 2021P in the first region 10 may be different from p-well 2022P in the second region 20.

The first region 10 and the second region 20 are device regions that include transistors meeting different requirements or implemented for different applications. In some embodiments, the first region 10 may be a region for high drive current ($I_{on}$) and high switching speed applications where power consumption and leakage are of lesser concerns. For example, the first region 10 may be a logic device region that includes an inverter, NAND, NOR, AND, OR, or Flip-Flop device. In some implementations, a plurality of GAA transistors may be fabricated in the first region 10 to form a standard cell for high drive current ($I_{on}$) and high switching speed applications. In other embodiments, the second region 20 may be a region for low-leakage and power-conserving applications where performance and speed are of lesser concerns. In some examples, the second region 20 may also be a logic device region that includes an inverter, NAND, NOR, AND, OR, or Flip-Flop device. Similarly, a plurality of GAA transistors may be fabricated in the second region 20 to form a standard cell for low-leakage and power-conserving applications. In some embodiments, an IC device that includes standard cells in the first region 10 and the second region 20 may have different modes of operations. For example, the IC device may have a power-saving mode and a performance mode. In the power-saving mode where computing power requirement is low, the high-performance transistors in the first region 10 may be put to stand by or sleep while the power-conserving transistors in the second region 20 shoulder the operation. In the performance mode where computing power requirement is high, the high performance transistors in the first region 10 may be put to work to crank up the speed.

In the embodiments represented in FIG. 2, the plurality of alternating semiconductor layers 2040 includes a plurality of first semiconductor layers 204A interleaved by a plurality of the second semiconductor layers 204B. That is, two neighboring first semiconductor layers 204A sandwich one second semiconductor layer 204B. The plurality of first semiconductor layers 204A is formed of a first semiconductor material and the plurality of second semiconductor layers 204B is formed of a second semiconductor material that is different from the first semiconductor material. In some embodiments, the first semiconductor material is or consists essentially of silicon (Si) and the second semiconductor material is or consists essentially of germanium (Ge). In some other embodiments, the first semiconductor material is or consists essentially of silicon (Si) and the second semiconductor material includes silicon germanium (SiGe) with a germanium content between about 15% and about 40%. The plurality of alternating semiconductor layers 2040 may be formed by depositing or epitaxially growing the plurality of first semiconductor layers 204A and the plurality of second semiconductor layers 204B alternatingly. In some implementations illustrated in FIG. 2, each of the plurality of first semiconductor layers 204A includes a first thickness L1 and each of the plurality of second semiconductor layers 204B includes a second thickness L2. In some instances, a ratio of the first thickness L1 to the second thickness L2 (L1/L2) is between about 0.5 and about 2.0. In some implementations, after the plurality of alternating semiconductor layers 2040 is patterned into fin structures (fin-shaped active regions), a portion of the plurality of the second semiconductor layers 204B in channel regions may be selectively removed to release channel members formed from the plurality of the first semiconductor layers 204A. In this regard, the second semiconductor layers 204B function as sacrificial semiconductor layers and may be referred to as so.

Figure 3:
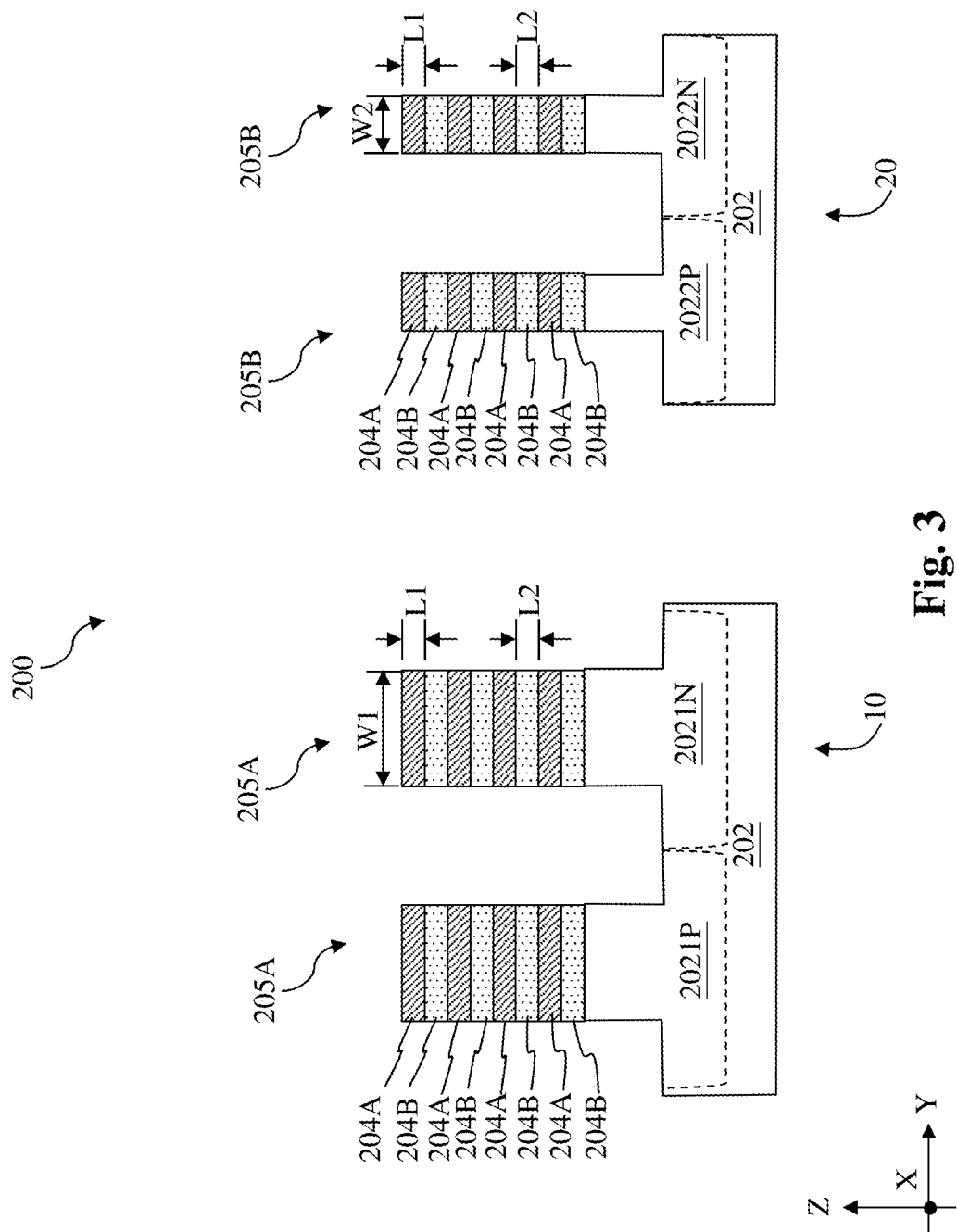

Referring now to FIGS. 1 and 3, the method 100 includes a block 104 where a first fin structure 205A is formed in the first region 10 and a second fin structure 205B is formed in the second region 20. In some embodiments represented in FIG. 3 the plurality of alternating semiconductor layers 2040 over the first region 10 may be patterned to form the first fin structures (or first fin-shaped active regions) 205A and the plurality of alternating semiconductor layers 2040 over the second region 20 may be patterned to form the second fin structures (or second fin-shaped active regions) 205B. At block 104, the first fin structures 205A and the second fin structures 205B may be patterned by using suitable processes such as photolithography and etching processes. In some embodiments, the first and second fin structures 205A and 205B are etched from the respective alternating semiconductor layers using dry etch or plasma processes. In some other embodiments, the first and second fin structures 205A and 205B can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. As shown in FIG. 3, the first fin structures 205A may extend from respectively doped regions, including the p-type doped region 2021P and n-type doped region 2021N in the first region 10 and the second fin structures 205B may extend from respective doped regions, including the p-type doped region 2022P and n-type doped region 2022N in the second region 20. As illustrated in FIG. 3, in some embodiments, the substrate 202 is also etched at block 104.

The first fin structures 205A and the second fin structure 205B may have different widths along the Y direction along which the gate stacks extend. In embodiments of the present disclosure, each of the first fin structures 205A has a first width W1 and each of the second fin structures 205B has a second width W2. In order for channel members to be formed from the first fin structures 205A to be suitable for high drive currents/low threshold voltage applications and channel members to be formed from the second fin structures 205B to be suitable for low drive current/high threshold voltage applications, the second width W2 is smaller than the first width W1. A ratio of the first width W1 to the second width W2 is selected based on different requirements of drive currents and threshold voltages and associated consideration. Given the same channel member thickness, a cross-sectional area of the channel is proportional to the width of the channel members. In terms of threshold voltage, channel member width is substantially inversely proportional to the threshold voltage. That is, a 20% increase in channel width may translate into about 20% decrease in threshold voltage. While channel member width increase may lead to benefits in drive current and low threshold voltage, the width of channel members is not without its cost because it may lead to increase of size of a semiconductor device and reduction of number of devices on a substrate. In addition, incorporating channel member width increase in a design is hardly free. It has been observed that unless the channel width differential is less than about 20%, design houses are not willing to increase the device size and go through all the trouble. In consideration of the foregoing, a ratio of the first width W1 to the second width W2 in embodiments of the present disclosure is between about 1.2 and about 6, including between about 1.4 and about 4.

Figure 4:
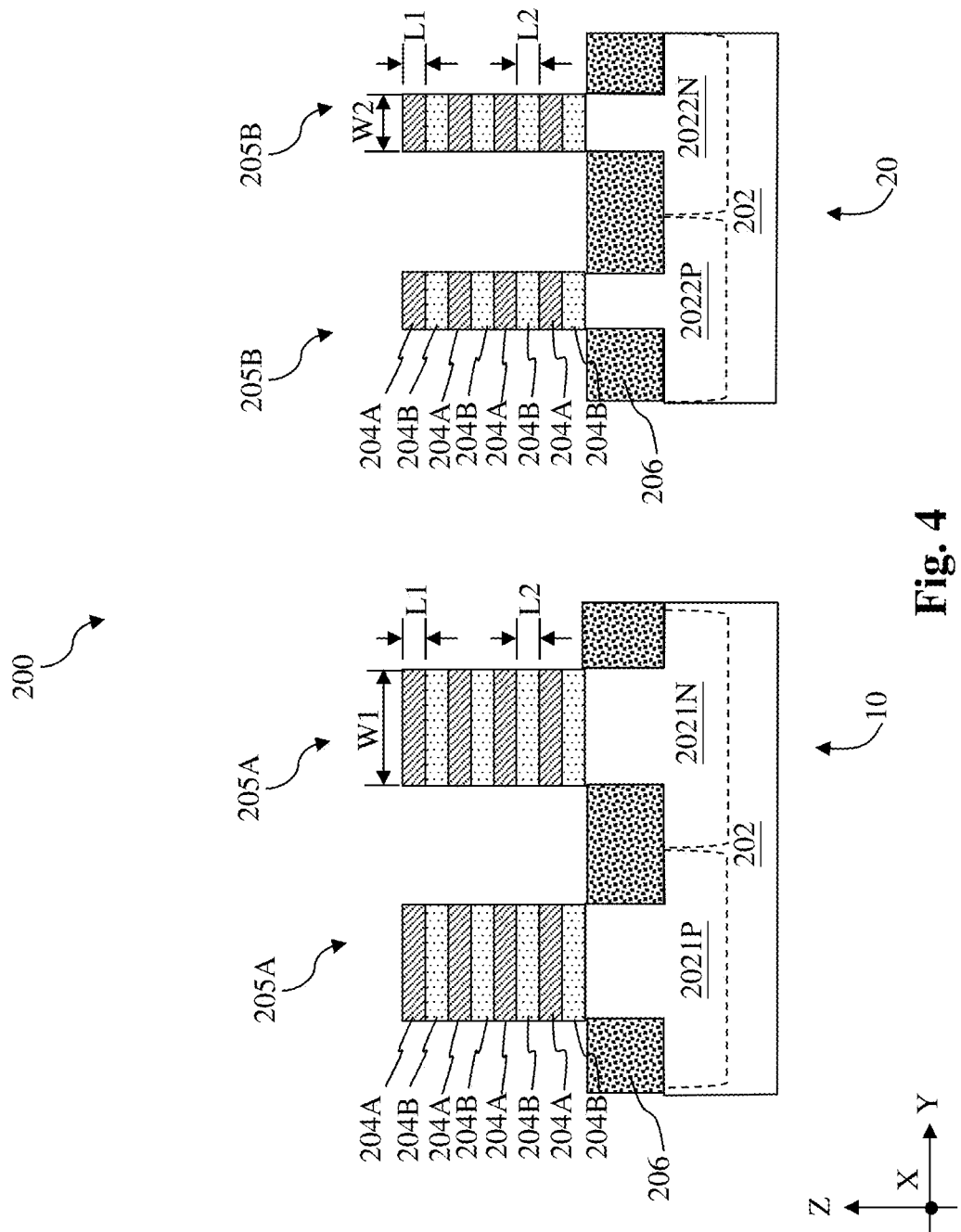

Reference is now made to FIG. 4. In some embodiments, dielectric isolation features 206 are formed by depositing a dielectric material in the recess between neighboring fin structures and then pulling back the deposited dielectric material to expose the plurality of alternating semiconductor layers 2040. The dielectric isolation features 206 may also be referred to as shallow trench isolation (STI) features 206.

Figure 5:
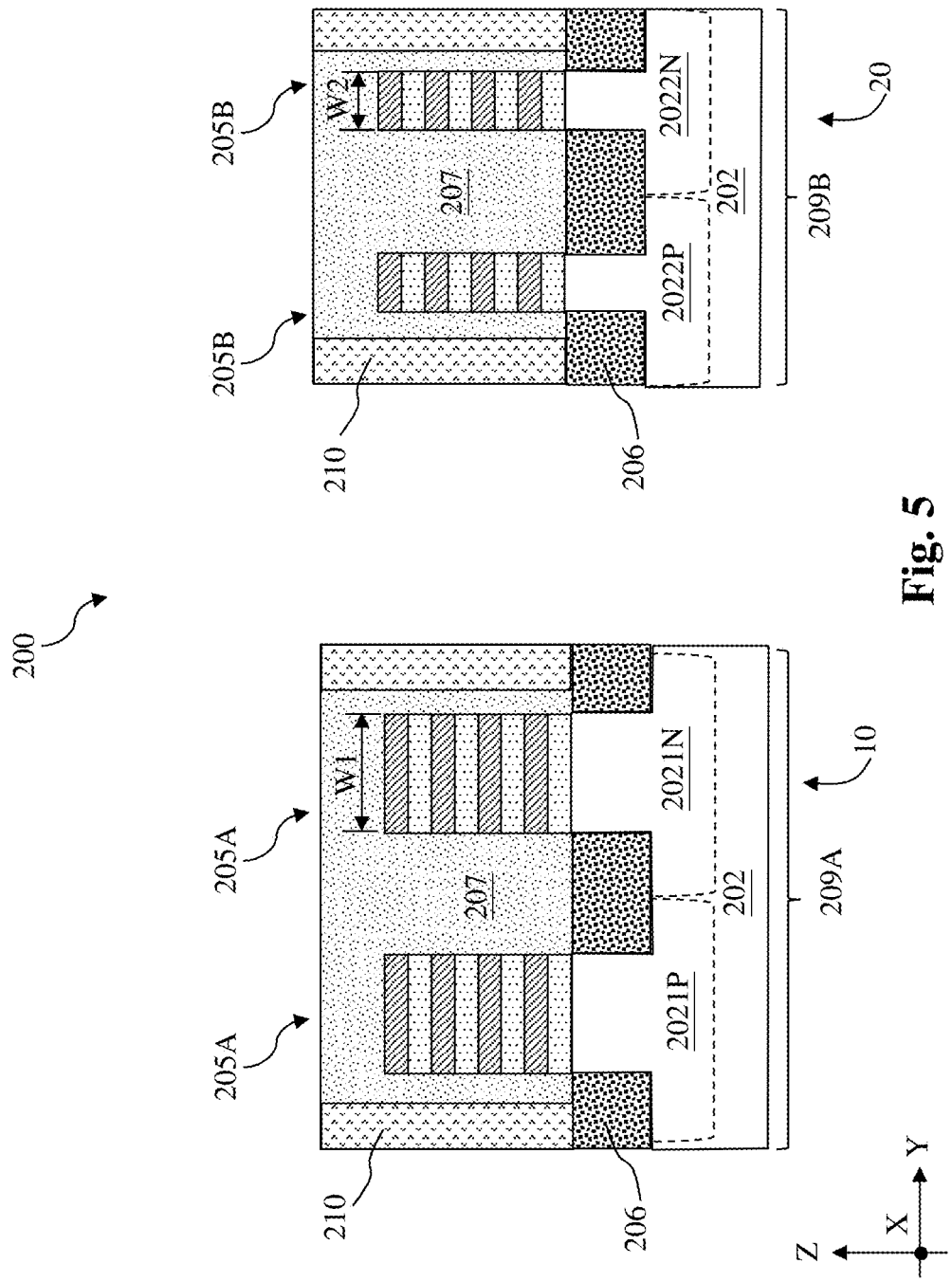

Referring FIGS. 1 and 5, the method 100 includes a block 106 where dummy gate stacks 207 are formed over a first channel region 209A of the first fin structures 205A structure and a second channel region 209B of the second fin structures 205B. In this regard, FIG. 5 illustrates fragmentary cross-sectional view of the workpiece 200 in the first region 10 and the second region 20 across the first channel region 209A and the second channel region 209B. In some embodiments, a gate-last process flow is adopted and the dummy gate stacks 207 are first formed as placeholders for the metal gate stacks 208 (shown in FIG. 9A; alternatively for an n-type gate stack 211-1 and a p-type gate stack 211-2 shown in FIG. 9B) to be formed at a later point. Because the metal gate stacks 208 are formed later in the process to replace the dummy gate stacks 207, damages to the metal gate stacks 208 from various processes may be averted. In some implementations, the dummy gate stack 207 includes a dummy gate dielectric layer. The dummy gate stacks 207 may be formed of polysilicon and the dummy gate dielectric layer may be formed of silicon oxide or silicon oxide doped with nitrogen.

In some embodiments, one or more gate spacers (or gate spacer layers) 220 (shown in FIG. 10) are formed over the dummy gate stack 207. The one or more gate spacers 220 are disposed over and alongside surfaces (or sidewalls) of the dummy gate stack 207. The one or more gate spacers 220 may provide isolation between the metal gate stack 208 (after the gate replacement process) and neighboring source/drain contacts and may also protect structures adjacent to the dummy gate stack 207 when the dummy gate stack 207 is removed at a later time. In some embodiments, one or more dielectric dummy gate stacks 218 (shown in FIG. 10) may be formed along with the dummy gate stacks 207 to separate active regions into multiple segments or to separate cells of semiconductor devices. In some embodiments, each of the one or more gate spacers 220 may include one or more dielectric materials selected from a group consisting of silicon oxide, silicon oxynitride, silicon nitride, silicon oxycarbonitride, a low-k dielectric material with a dielectric constant lower than 4, or a combination thereof.

In some embodiments, the dummy gate stack 207 in FIG. 5 may undergo a dummy gate cut process, resulting in gate end dielectric features, such as the gate end dielectric features 210 shown in FIG. 5. Although only the dummy gate stack 207 is shown in FIG. 5 to be separated into more than one segment in the dummy gate cut process, the gate end dielectric feature 210 may serve as separation features to divide the metal gate stack 208 into segments, after the gate replacement process.

Figure 10:
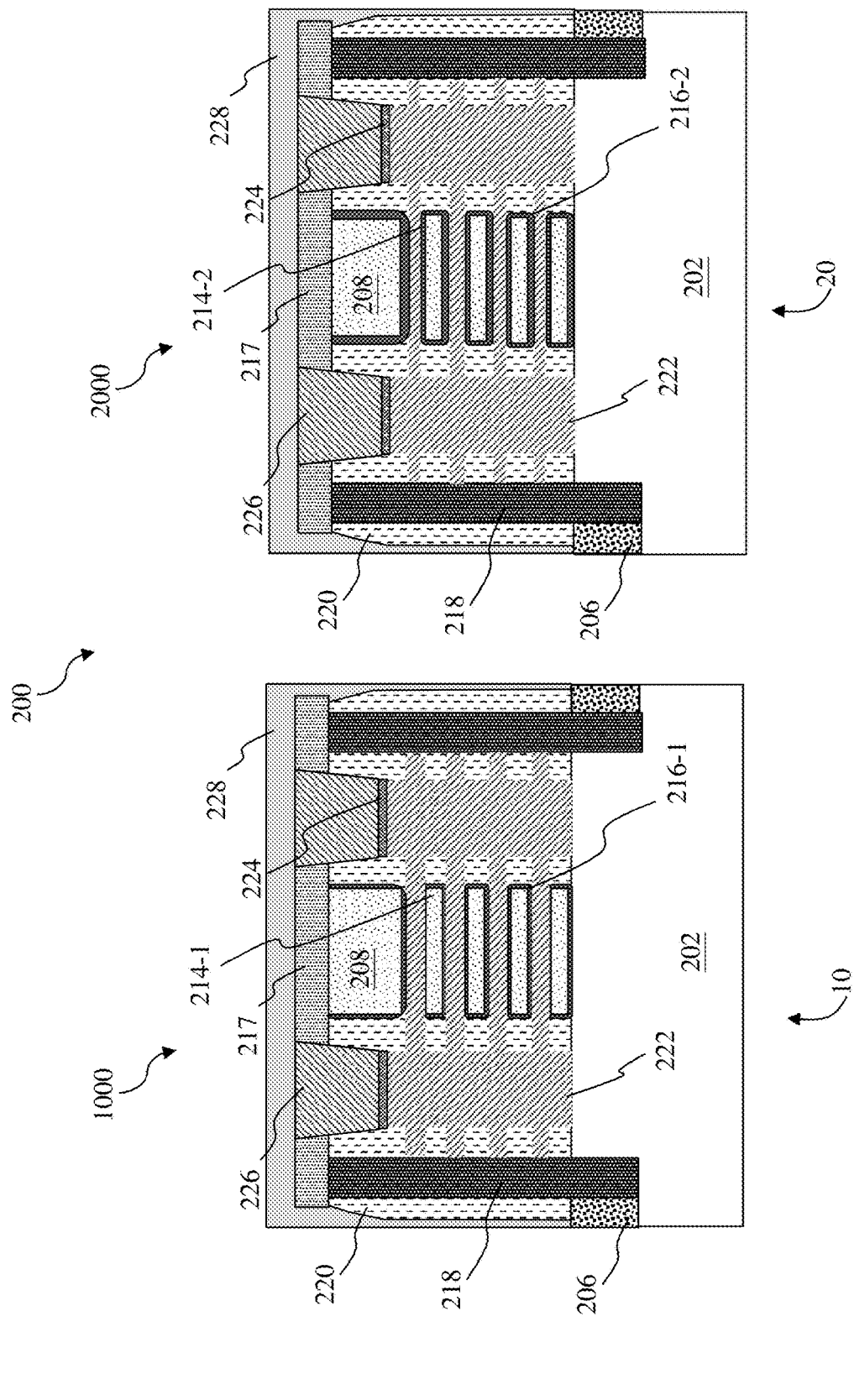

Referring to FIG. 1, the method 100 includes a block 108 where source/drain features 222 are formed adjacent the dummy gate stacks 207. While FIG. 10 is mainly for illustration of further processes that may be performed to the workpiece 200 at block 120, it illustrates relative positions and structures of source/drain features 222 formed at block 108 of the method 100. In some embodiments, source/drain regions of the first fin structures 205A and the second fin structures 205B in FIG. 5 are recessed to expose the sidewalls of the channel regions of the first fin structures 205A and the second fin structures 205B. In some implementations, the plurality of the second semiconductor layers 204B of the first fin structure 205A and the second fin structure 205B may be partially and selectively etched to form recesses. A spacer dielectric material may then be deposited over the workpiece 200, including within the recesses. The deposited spacer dielectric material is then pulled back to form inner spacers in the recesses such that the plurality of the first semiconductor layers 204A of the first fin structures 205A and the second fin structures 205B are exposed. That is, the plurality of the first semiconductor layers 204A of the first fin structures 205A and the second fin structures 205B are partially separated by the inner spacers at either ends along the length of the channel. Then, n-type semiconductor materials, such as phosphorous-doped silicon (SiP), carbon-doped silicon (SiC), arsenic-doped silicon (SiAs), silicon (Si), or a combination thereof or p-type semiconductor materials, such as silicon germanium (SiGe), carbon-doped silicon germanium (SiGeC), germanium (Ge), or a combination thereof, may be epitaxially formed in the source/drain regions on the substrate 202 and the plurality of first semiconductor layers 204A to form the source/drain features 222. Although not separately shown, the source/drain features 222 may include n-type source/drain features formed from the aforementioned n-type semiconductor materials and the p-type source source/drain features formed from the aforementioned p-type semiconductor materials. The n-type source/drain features and p-type source/drain features may be formed sequentially and separately using photolithography techniques and more than one mask. For example, the n-type source/drain features may be formed first while the p-type source/drain regions are covered by a photolithographically patterned hard mask and then the p-type source/drain features may be formed while the n-type source/drain regions are covered by another photolithographically patterned hard mask. In some other examples, the p-type source/drain features may be formed first.

Referring to FIG. 1, the method 100 includes a block 110 where a dielectric layer is formed over the substrate 202. The dielectric layer may be referred to as an interlayer dielectric (ILD) layer. In some embodiments, the dielectric layer may include silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In some implementations, the dielectric layer may be formed over the workpiece 200 using CVD, flowable CVD (FCVD), or spin-on-glass. In some instances, block 110 may further include a planarization process to planarize a top surface of the dielectric layer before further processes.

Figure 6:
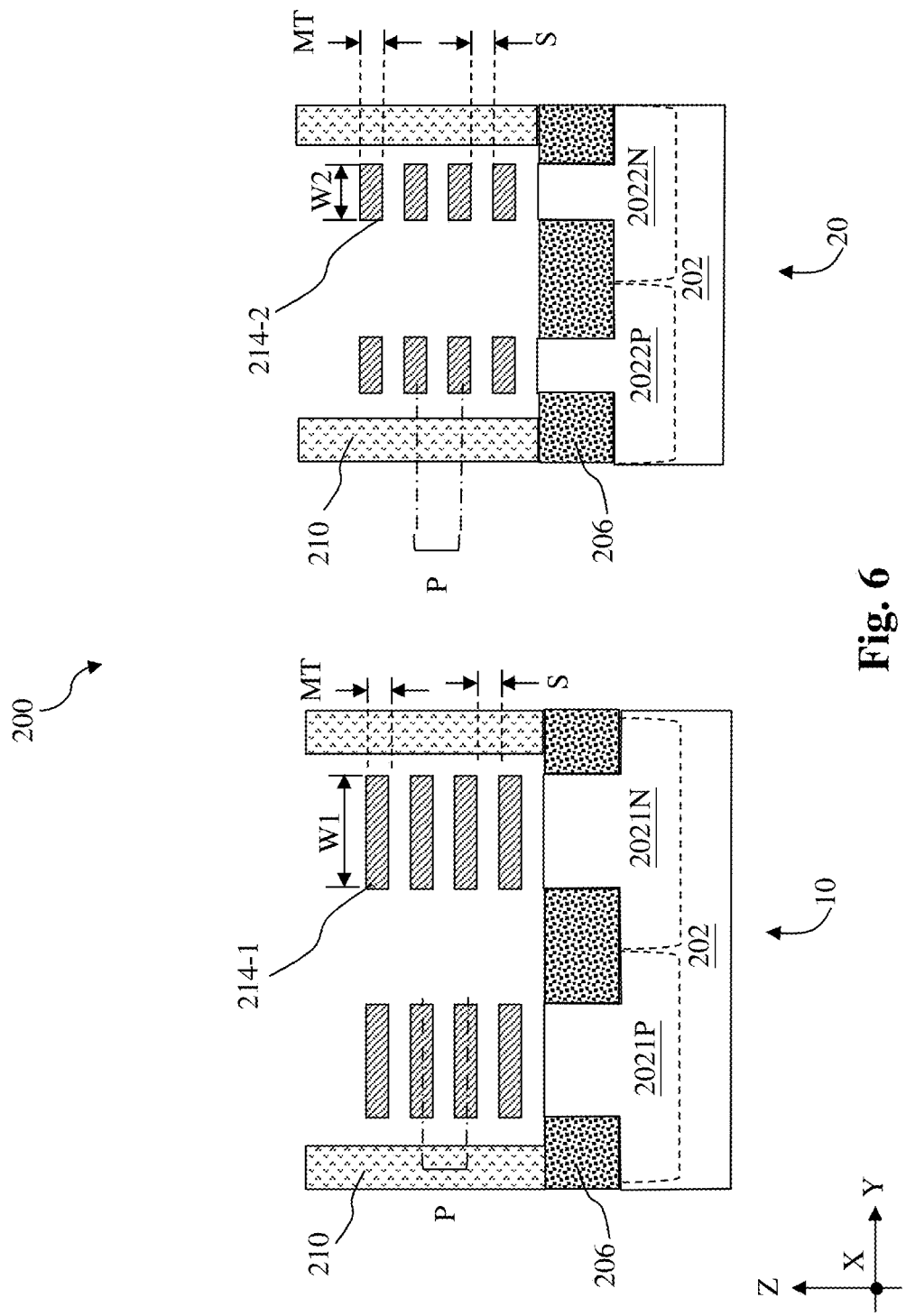

Referring to FIGS. 1 and 6, the method 100 includes a block 112 where first channel members 214-1 in the first channel region 209A of the first fin structure 205A and second channel members 214-2 in the second channel region 209B of the second fin structure 205B are released. In some embodiments, at block 112, the dummy gate stacks 207 in the first channel region 209A of the first fin structure 205A and the second channel region 209B of the second fin structure 205B are removed to expose the first and second channel regions 209A and 209B. Then the exposed first and second channel regions 209A and 209B are subject to a selective etching process to selectively remove the plurality of second semiconductor layers 204B in the first and second fin structures 205A and 205B. After the plurality of second semiconductor layers 204B are removed, the first semiconductor layers 204A in the first fin structures 205A are released to become first channel members 214-1 and the first semiconductor layers 204A in the second fin structures 205B are released to become second channel members 214-2. In some implementations, the plurality of second semiconductor layers 204B is formed of silicon germanium. In those implementations, the plurality of second semiconductor layers 204B may be first oxidized by an oxidizer, such as ozone, and then removed by a selective etch process that is selective to silicon germanium oxide. The first channel members 214-1 and the second channel members 214-2 share a pitch P based on middle lines of each of the first channel members 214-1 and each of the second channel members 214-2 along the Z direction. In some instances, the pitch P may be between about 10 nm and about 20 nm. Each of the first channel members 214-1 and the second channel members 214-2 has a member thickness MT along the Z direction. In some instances, the member thickness MT may between about 4 nm and about 8 nm. Any two of the neighboring first channel members 214-1 or neighboring second channel members 214-2 are separated by a spacing S. In some instances, the spacing S may be between about 6 nm and about 15 nm. The pitch P may also be defined as a summation of the member thickness MT and the spacing S.

The first channel members 214-1 may inherit the first width W1 of the first fin structure 205A and the second channel members 214-2 may inherit the second width W2 of the second fin structure 205B. As a ratio of W1 to W2 is between about 1.2 and about 10.0, each of the first channel members 214-1 may have an appearance of a sheet and each of the second channel members 214-2 may have an appearance of a wire. Hence, the first channel members 214-1 may be referred to as nanosheets and the second channel members 214-2 may be referred to as nanowires. In some instances, both the first channel members 214-1 and the second channel members 214-2 may be collectively referred to as nanostructures or nano-structures.

Figure 7:
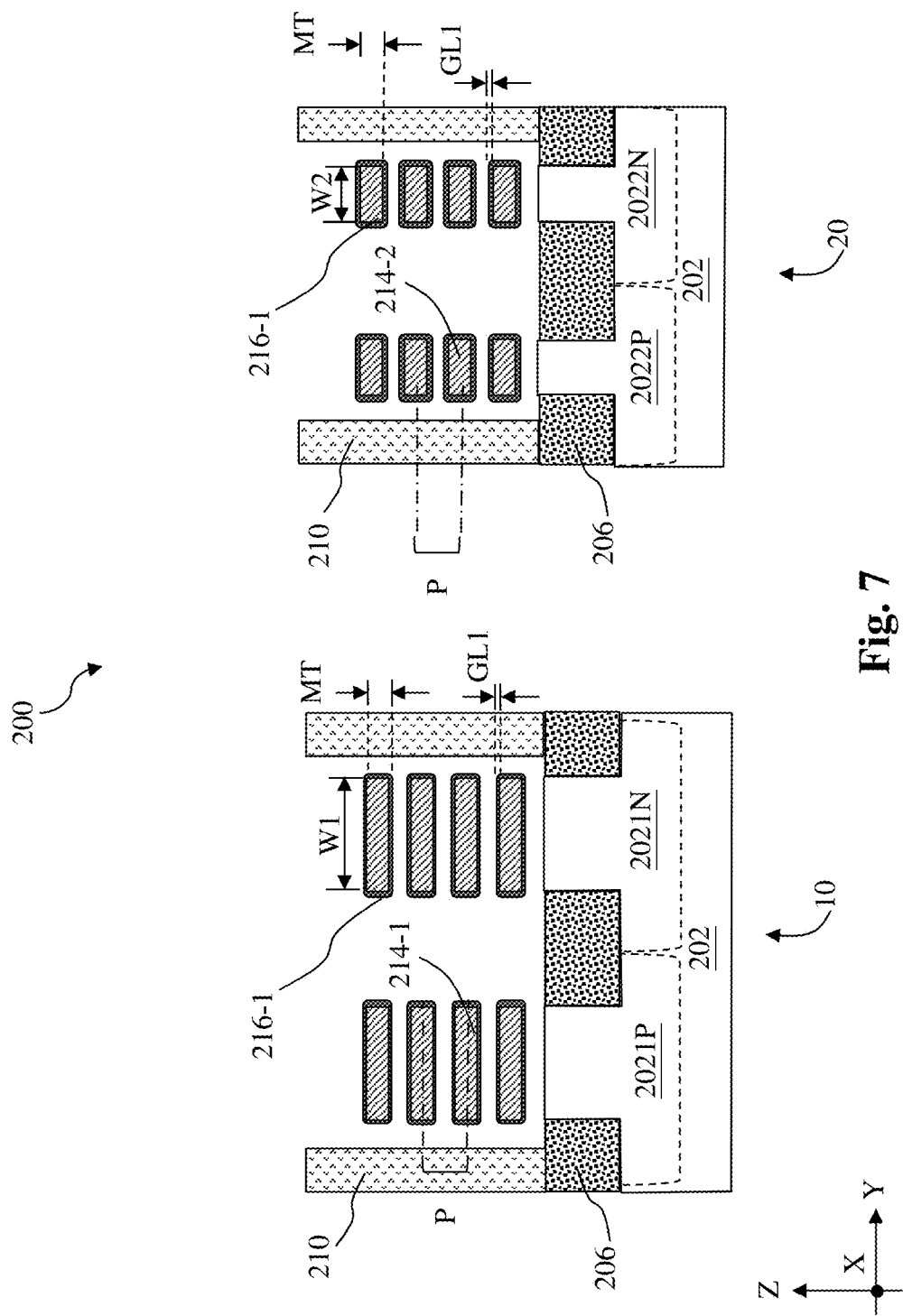

Referring to FIGS. 1 and 7, the method 100 may include a block 114 where a first gate dielectric layer 216-1 is formed over the first channel members 214-1 and the second channel members 214-2. In some embodiments, the first gate dielectric layer 216-1 may include an interfacial layer and a high-k dielectric layer. In some of those embodiments, the interfacial layer may include silicon oxide that is not doped or is doped with nitrogen. In some implementations, the high-k dielectric layer may include one or more metal oxides, such as ZrO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The high-k dielectric layer has a dielectric constant greater than 9, including greater than 13. The first gate dielectric layer 216-1 may be deposited using atomic layer deposition (ALD), plasma-enhanced atomic layer deposition (PEALD), or other suitable method. In some embodiments, the first gate dielectric layer 216-1 has a first gate dielectric layer thickness GL1. In some instances, the first gate dielectric layer thickness GL1 is between about 10 Å and about 30 Å.

Figure 8:
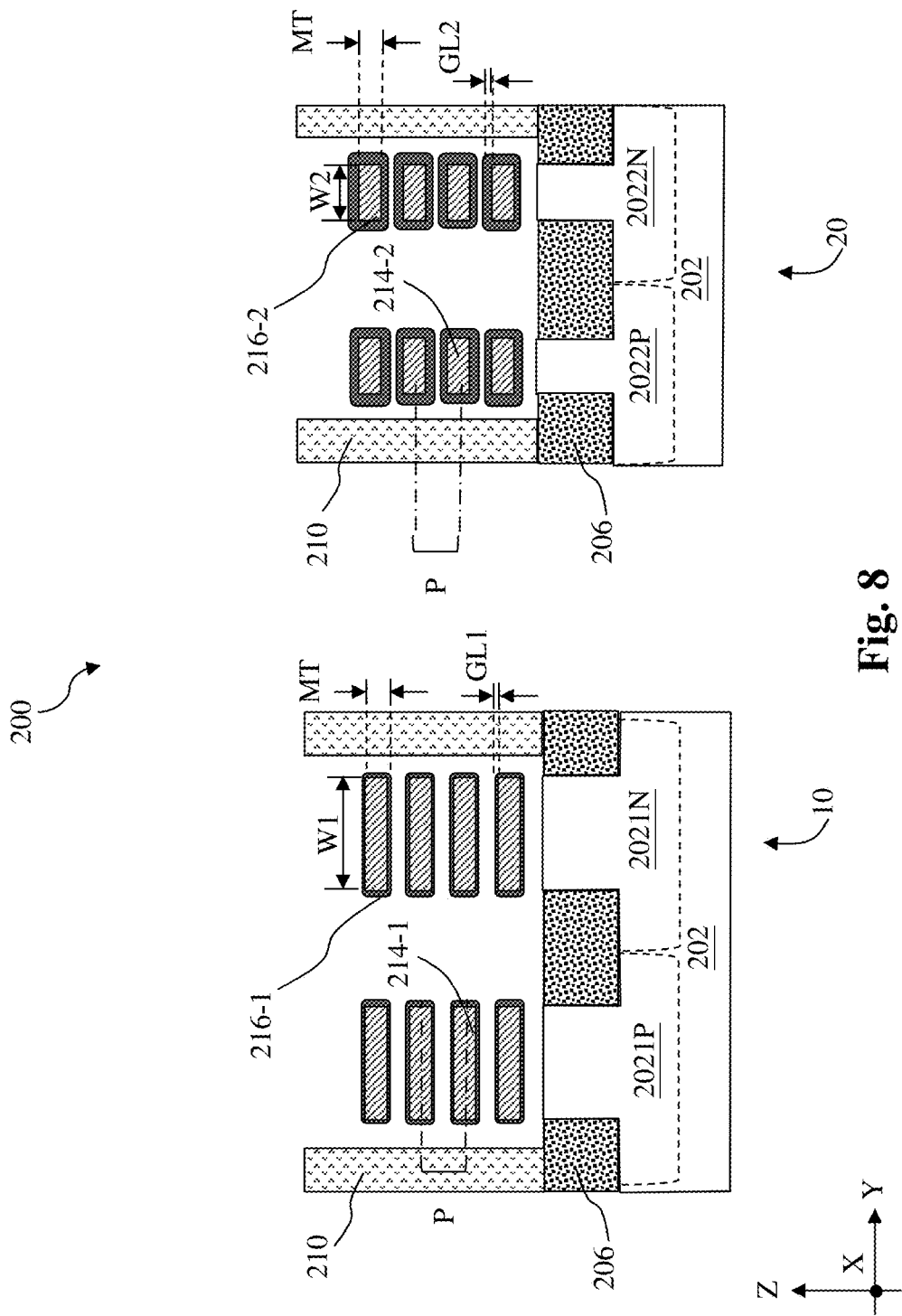

Referring to FIGS. 1 and 8, the method 100 may include a block 116 where a second gate dielectric layer 216-2 is formed over the second channel members 214-2 in the second channel region 209B. In some embodiments, lithography processes may be used to mask off the first channel members 214-1 in the first channel region 209A and additional gate dielectric layer may be deposited over the first gate dielectric layer 216-1 over the second channel members 214-2 to form the second gate dielectric layer 216-2. For example, a dielectric filler material may be deposited over the first region 10 and the second region 20 by a suitable process, such as spin-on coating. The deposited dielectric filler material is then planarized. Thereafter, one or more hard mask layers may be formed over the first region 10 and the second region 20. In some embodiments, the one or more hard mask layers may be formed of semiconductor oxide, such as silicon oxide, or semiconductor nitride, such as silicon nitride and may be deposited using chemical vapor deposition (CVD), flowable CVD (FCVD), spin-on coating, or other suitable technique. Thereafter, a photoresist layer is deposited over the one or more hard mask layers using CVD, FCVD, spin-on coating, or other suitable technique. The photoresist layer is then exposed to radiation reflected from or going through a patterned mask. After being subject to a post-exposure bake, the exposed photoresist layer may undergo chemical changes that allow the exposed or the unexposed portions of the photoresist layer to be removed by a developer to form a patterned photoresist layer. At block 116, the patterned photoresist layer may expose the one or more hard mask layers over the second region 20 while covering the one or more hard mask layers over the first region 10. The patterned photoresist layer may then be used as an etch mask to pattern the one or more hard mask layers to form a patterned hard mask. The patterned hard mask covers the first region 10 and exposes the second region 20. The patterned hard mask may then be used as an etch mask to remove the dielectric filler material over the second channel region 209B to expose the first gate dielectric layer 216-1 in the second region 20. In some embodiments, the additional gate dielectric layer may include high-k dielectric materials such as $ZrO$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The additional gate dielectric layer is stacked over the first gate dielectric layer 216-1 to form the second gate dielectric layer 216-2. Therefore, the second gate dielectric layer 216-2 has a second gate dielectric layer thickness GL2 that is greater than the first gate dielectric layer thickness GL1. It is noted that the second gate dielectric layer thickness GL2 is limited by whether the second gate dielectric layer thickness GL2 leaves sufficient space for formation the metal gate stacks to be described below. In some instances, the second gate dielectric layer thickness GL2 is between about 12 Å and about 32 Å. In some embodiments, a ratio of GL2 to GL1 (GL2/GL1) may be between about 1.05 and about 1.3. In some instances, a difference between GL2 and GL1 may be between about 1 Å and 10 Å. In some implementations, the first gate dielectric layer 216-1 and the second gate dielectric layer 216-2 may be similar in composition while GL2 of the second gate dielectric layer 216-2 includes a thicker high-k dielectric layer than GL1 of the first gate dielectric layer 216-1. Due to the thicker second gate dielectric layer 216-2, the GAA transistors to be formed in the second region 20 has a higher threshold voltage due to better DIBL performance and is suitable for applications that require low leakage.

Figure 9A:
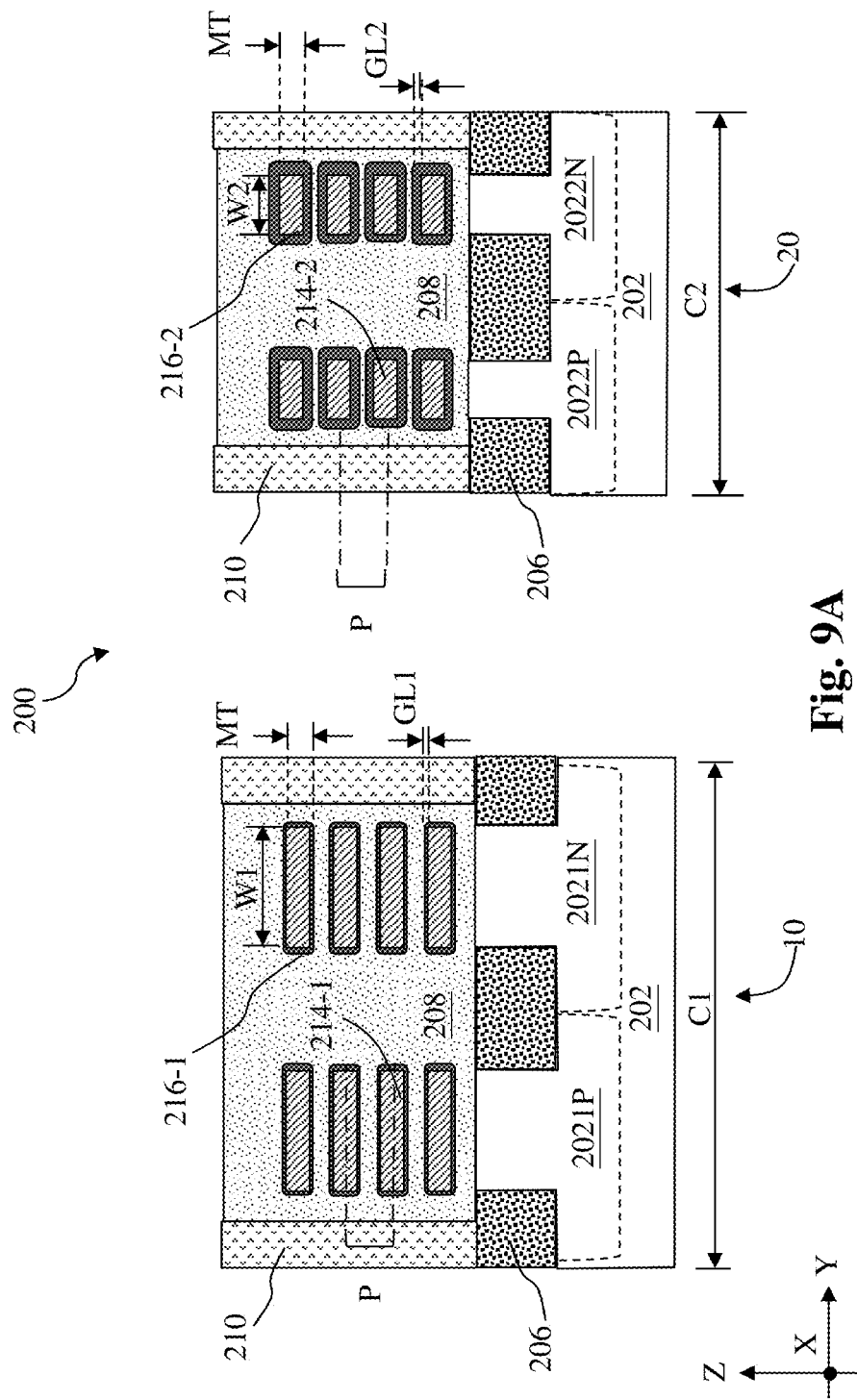
Figure 9B:
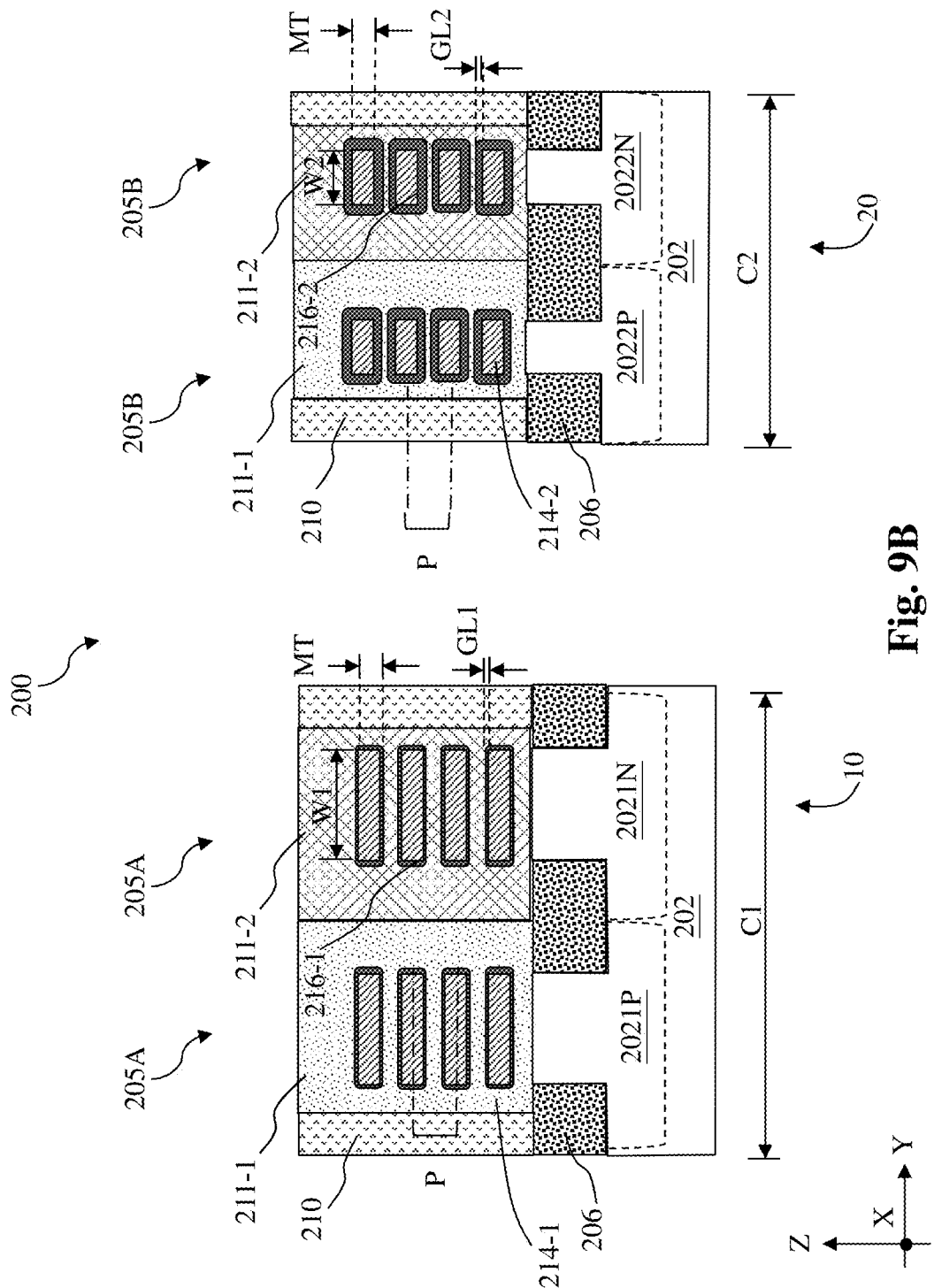

Referring to FIGS. 1, 9A and 9B, the method 100 includes a block 118 where metal gate stacks are formed over the first channel regions 209A in the first region 10 and the second channel region 209B in the second region 20. In some embodiments represented in FIG. 9A, a common metal gate stack 208 may be formed over the first channel members 214-1 in the first channel region 209A and over the second channel members 214-2 in the second channel region 209B. The common metal gate stack 208 may include work function metal layers and fill metal layers. The choice of material for a work function metal layer may be determined by an overall threshold voltage desired for the GAA transistor in the first region 10 or the second region 20. Exemplary p-type work function metals include TiN, TaN, Ru, Mo, Al, WN, $ZrSi_2$, $MoSi_2$, $TaSi_2$, $NiSi_2$, WN, and/or other suitable p-type work function materials. Suitable n-type work function metals include Ti, Ag, TaAl, TaAlC, TiAlN, TaC, TaCN, TaSiN, Mn, Zr, and/or other suitable n-type work function materials. Further, a fill metal layer formed over the work function metal layer may include copper (Cu), ruthenium (Ru), tungsten (W), aluminum (Al), cobalt (Co), and/or other suitable materials. The fill metal layer may be formed by ALD, CVD, PVD, plating, and/or other suitable processes. In some embodiments, a CMP process may be performed to reduce a height of the common metal gate stack 208 to a desired level.

Alternatively, in embodiments represented in FIG. 9B, instead of a common metal gate stack 208, an n-type metal gate stack 211-1 is formed over the first channel members 214-1 and the second channel members 214-2 over the p-wells (2021P and 2022P) and a p-type metal gate stack 211-2 is formed over the first channel members 214-1 and the second channel members 214-2 over n-wells (2021N and 2022N). In these alternative embodiments, the n-type metal gate stack 211-1 may include a first work function metal stack formed of layer of n-type work function metals and the p-type metal gate stack 211-2 may include a second work function metal stack formed of layers of p-type work function metals. In some implementations, the n-wells and the p-wells may be separately masked off when forming the n-type work function metal stack in the n-type metal gate stack 211-1 and the p-type work function metal stack in the p-type metal gate stack 211-2 separately. In some implementations, the difference between the n-type metal gate stack 211-1 and the p-type metal gate stack 211-2 lies substantially in the different work function metal stacks and may include a common metal fill layer.

Referring to FIGS. 1 and 10, the method 100 includes a block 120 where further processes are performed. Such further processes may include formation of a gate-top hard mask 217 over the common metal gate stack 208 (or the n-type metal gate stack 211-1 and the p-type metal gate stack 211-2), formation of a silicide layer 224, formation of source/drain contacts 226, and formation of another ILD layer 228. In some embodiments, the source/drain contacts 226 may include one or more metal layers selected from a group that includes titanium (Ti), titanium nitride (TiN), nickel (Ni), molybdenum (Mo), platinum (Pt), cobalt (Co), ruthenium (Ru), tungsten (W), tantalum nitride (TaN), copper (Cu), or a combination thereof. FIG. 10 illustrate a first-type GAA transistor 1000 in the first region 10 and a second-type GAA transistor 2000 in the second region 20. Depending on the type of wells and the configuration of the work function metal stacks, the first-type GAA transistor 1000 may be n-type or p-type. Similarly, the second-type GAA transistor 2000 may be n-type or p-type.

Figure 11:
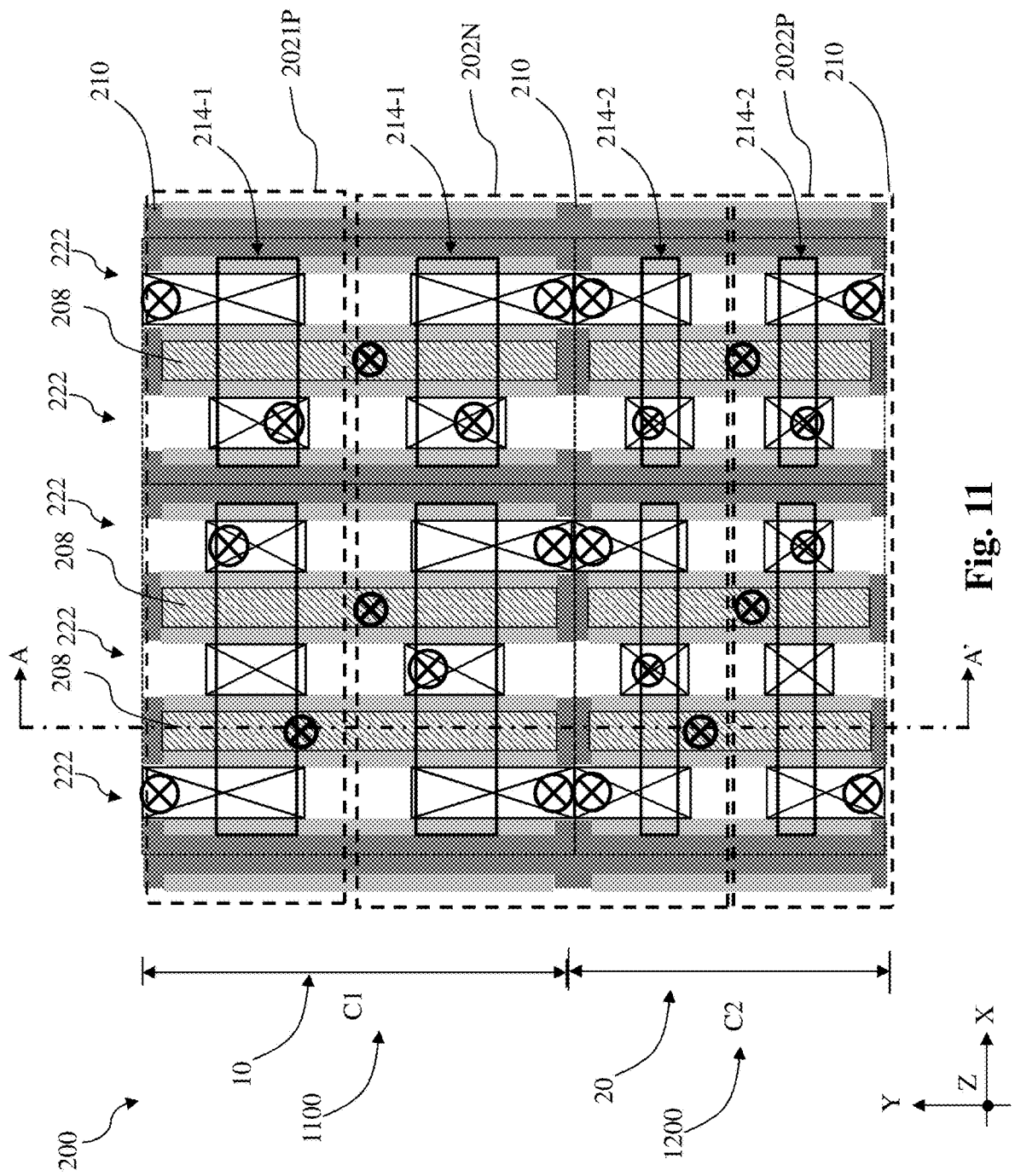
FIG. 11 illustrates a schematic top view of a semiconductor device having two adjacent standard cells, according to aspects of the present disclosure.
Figure 12:
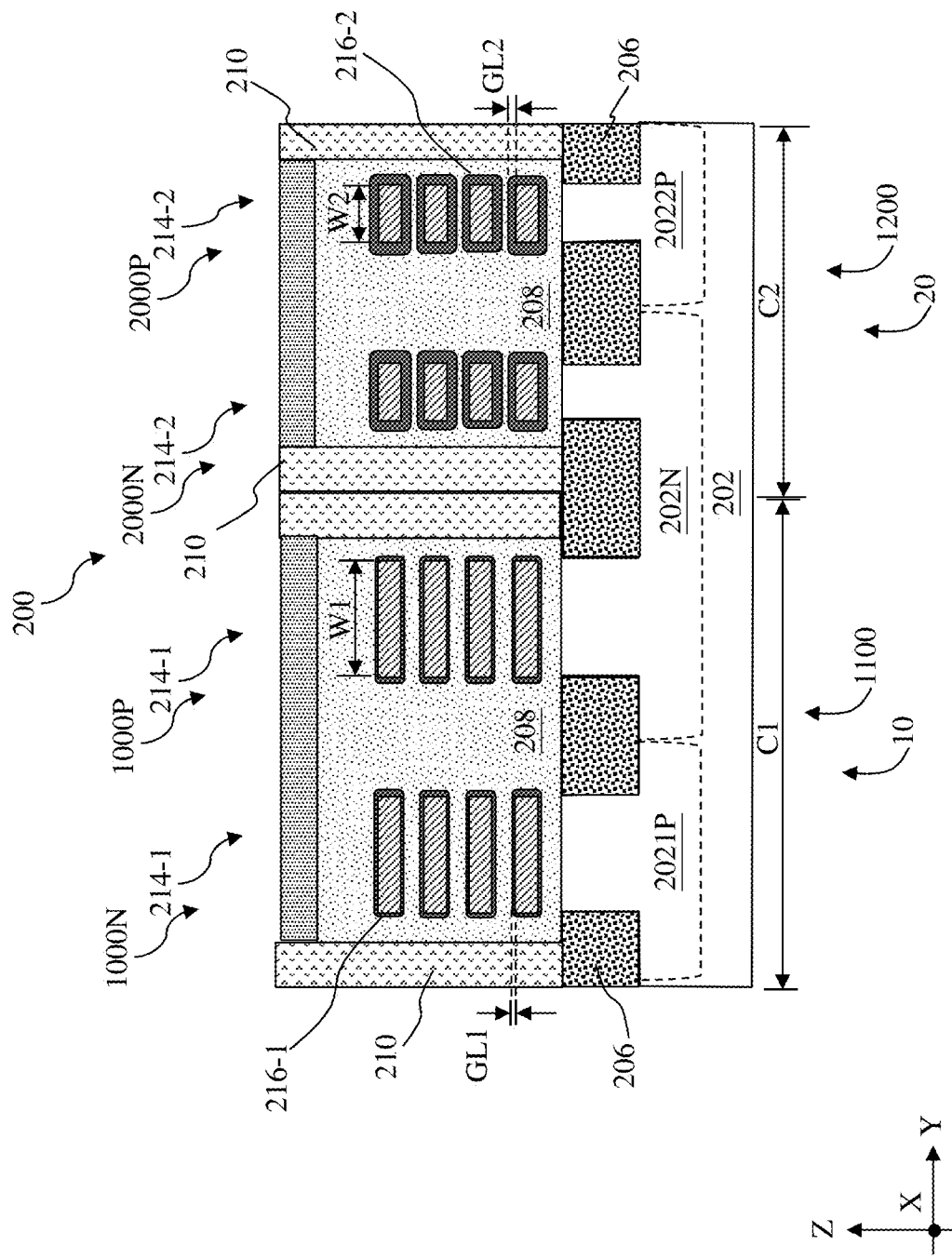
FIG. 12 illustrates a fragmentary cross-sectional view of the semiconductor device in FIG. 11, according to various aspects of the present disclosure.

Reference is now made to FIGS. 11 and 12. FIG. 11 illustrates a schematic top view of a semiconductor device 200 having two adjacent standard cells, which include a first standard cell 1100 in the first region 10 and a second standard cell 1200 in the second region 20. FIG. 12 illustrates a fragmentary cross-sectional view of the semiconductor device in FIG. 11 along section A-A' in the Y direction. In the embodiments represented by FIG. 11, the first standard cell 1100 and the second standard cell 1200 may abut one another along the gate direction (Y direction) and are separated by one or more gate end dielectric features 210. In other embodiments not shown in FIG. 11, the first standard cell 1100 and the second standard cell 1200 may abut one another along the fin structure direction (X direction) and may be separated by one or more dielectric dummy gate stacks (such as the dielectric dummy gate stack 218 in FIG. 10), a gap filled with an interlayer dielectric layer, or one or more transistors whose gates are turned off permanently. In some instances, the first standard cell 1100 includes first-type GAA transistors that have first channel members 214-1 and the first gate dielectric layer 216-1 and the second standard cell 1200 includes second-type GAA transistors that have second channel members 214-2 and the second gate dielectric layer 216-2. As described above, each of the first channel members 214-1 is wider than each of the second channel members 214-2; and the second gate dielectric layer 216-2 is thicker than the first gate dielectric layer 216-1. The first-type GAA transistors in the first standard cell 1100 may be used for high performance applications and second-type GAA transistors in the second standard cell 1200 may be used for low-consumption applications. In a power-saving mode of a multi-threshold scheme, the second standard cell 1200 may be activated while the first standard cell 1100 is put to sleep or stands by, thereby reducing power consumption. In a performance mode of a multi-threshold scheme, the first standard cell 1100 may be activated for elevated performance in terms of switching speed and drive current levels.

In some embodiments, the first standard cell 1100 and the second standard cells 1200 may share a common n-well or a common p-well. Reference is made to FIG. 11. In some implementations, the first standard cell 1100 includes two groups of first channel members 214-1, each of which is formed from one first fin structure 205A. One group of the first channel members 214-1 is disposed over the p-type doped region (p-well) 2021P and are channel members for an n-type first-type GAA transistor 1000N. The other group of the first channel members 214-1 is disposed over the common n-type doped region (n-well) 202N and are channel members for a p-type first-type GAA transistor 1000P. Similarly, in these implementations, the second standard cell 1200 includes two groups of second channel members 214-2, each of which is formed from one second fin structure 205B. One group of the second channel members 214-2 is disposed over the p-type doped region (p-well) 2022P and are channel members for an n-type second-type GAA transistor 2000N. The other group of the second channel members 214-2 is disposed over the common n-type doped region (n-well) 202N and are channel members for a p-type second-type GAA transistor 2000P. The first standard cell 1100 and the second standard cell 1200 in FIG. 11 therefore share the common n-well 202N. This configuration is also illustrated in FIG. 12. As shown in FIG. 12, with regards to structures disposed above the STI, the first standard cell 1100 is separated from the second standard cell 1200 by two gate end dielectric features 210. While FIGS. 11 and 12 illustrate two groups of channel members for each standard cell and the two standard cells share a common n-type well, the present disclosure is not so limited. The present disclosure includes embodiments where each standard cell includes more than two groups of channel members and the two adjacent standard cells may share a common p-well, instead of a common n-well.

Reference is still made to FIGS. 11 and 12. In some embodiments, due to narrower second channel members 214-2, the second standard cell 1200 has a smaller cell height along the Y direction. In FIGS. 11 and 12, the first standard cell 1100 has a first cell height C1 and the second standard cell 1200 has a second cell height C2. As shown in FIG. 12, the height of a standard cell (such as the first standard cell 1100 and the second standard cell 1200) substantially consists a width of the isolation feature 206 and a width of the channel member (such as the first width W1 and the second width W2). As a rule of thumb, a width of the channel member accounts for about one half of the cell height. That is, one half of the amount of the width increase of the channel member would translate into increase of the cell height. As described above, a ratio of the first width W1 to the second width W2 in embodiments of the present disclosure is between about 1.2 and about 6, including between about 1.4 and about 4. It follows that in those embodiments, a ratio of C1 to C2 is between about 1.1 and about 3.5, including between about 1.2 and about 2.5.

Based on the above discussions, the present disclosure offers advantages over conventional semiconductor devices. It is understood, however, that other embodiments may offer additional advantages, and not all advantages are necessarily disclosed herein, and that no particular advantage is required for all embodiments. The present disclosure puts forth a semiconductor device that includes a first-type GAA transistor for high performance applications and a second-type GAA transistor for low-consumption applications. Both formed from the same stack of alternating semiconductor layers, the first-type GAA transistor has wider channel members and thinner gate dielectric layer and the second-type GAA transistor has narrower channel members and thicker gate dielectric layer. The first-type GAA transistor provides high speed and high drive current and the second-type GAA transistor provides low-leakage and low consumption.

The disclosure of the present disclosure provides embodiments of semiconductor devices and methods of forming the same. In one embodiment, a semiconductor device is provided. The semiconductor device includes a first gate-all-around (GAA) transistor including a plurality of first channel members, and a first gate dielectric layer over the plurality of first channel members; and a second GAA transistor including a plurality of second channel members, and a second gate dielectric layer over the plurality of second channel members. A first width (W1) of each of the plurality of first channel members is greater than a second width (W2) of each of the plurality of second channel members and a first thickness (GL1) of the first gate dielectric layer is smaller than a second thickness (GL2) of the second gate dielectric layer.

In some embodiments, the first GAA transistor is for high drive current applications and the second GAA transistor is for low leakage applications. In some implementations, a ratio of the first width (W1) to the second width (W2) is between about 1.2 and about 10.0. In some implementations, a difference between the second thickness (GL2) and the first thickness (GL1) is between about 1 Å and about 10 Å. In some instances, the first width (W1) is between about 12 nm and about 30 nm and the second width (W2) is between about 4 nm and about 15 nm.

In another embodiment, a semiconductor device is provided. The semiconductor device includes a substrate having a first region and a second region; a first n-type gate-all-around (GAA) transistor and a first p-type GAA transistor in the first region, wherein each of the first n-type GAA transistor and the first p-type GAA transistor includes a plurality of first channel members and a first gate dielectric layer over the plurality of first channel members; and a second n-type GAA transistor and a second p-type GAA transistor in the second region, wherein each of the second n-type GAA transistor and the second p-type GAA transistor includes a plurality of second channel members and a second gate dielectric layer over the plurality of second channel members. A first width (W1) of each of the plurality of first channel members is greater than a second width (W2) of each of the plurality of second channel members. A first thickness (GL1) of the first gate dielectric layer is smaller than a second thickness (GL2) of the second gate dielectric layer.

In some embodiments, the first region abuts the second region. In some implementations, the first region includes a first region height (C1) and the second region includes a second region height (C2) and a ratio of the first region height (C1) to the second region height (C2) is between about 1.1 and about 2.0. In some instances, the first p-type GAA transistor in the first region and the second p-type GAA transistor in the second region are disposed over an n-type well. In some implementations, the first n-type GAA transistor includes a first work function stack over the plurality of first channel members, the first p-type GAA transistor includes a second work function stack over the plurality of first channel members, and the first work function stack is different from the second work function stack. In some instances, the first region is for high drive current applications and the second region is for low leakage applications. In some instances, a ratio of the first width (W1) to the second width (W2) is between about 1.2 and about 10.0. In some implementations, a difference between the second thickness (GL2) and the first thickness (GL1) is between about 1 Å and about 10 Å. In some implementations, the first width (W1) is between about 12 nm and about 30 nm and the second width (W2) is between about 4 nm and about 15 nm.

In a further embodiment, a method is provided. The method includes forming a plurality of alternating semiconductor layers over a first region and a second region of a substrate, the plurality of alternating semiconductor layers comprising a plurality of first semiconductor layers interleaved by a plurality of second semiconductor layers; patterning the plurality of alternating semiconductor layers over the first region to form a first active region having a first width (W1); patterning the plurality of alternating semiconductor layers over the second region to form a second active region having a second width (W2) smaller than the first width (W1); releasing the plurality of first semiconductor layers from the plurality of second semiconductor layers to form first channel members in a first channel region of the first active region and second channel members in a second channel region of the second active region; forming a first gate dielectric layer over the first channel members, the first gate dielectric layer having a first thickness (GL11); and forming a second gate dielectric layer over the second channel members, the second gate dielectric layer having a second thickness (GL2) greater than the first thickness (GL1).

In some embodiments, a ratio of the first width (W1) to the second width (W2) is between about 1.2 and about 10.0. In some implementations, a difference between the second thickness (GL2) and the first thickness (GL1) is between about 1 Å and about 10 Å. In some instances, the forming of the first gate dielectric layer over the first channel members includes simultaneously forming the first gate dielectric layer over the second channel members. In some embodiments, the forming of the second gate dielectric layer includes forming an additional gate dielectric layer over the first gate dielectric layer disposed over the second channel members. In some instances, the forming of the second gate dielectric layer includes masking the first gate dielectric layer over the first channel members.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A semiconductor device, comprising:
   a first gate-all-around (GAA) transistor comprising:
      a plurality of first channel members extending between a first source/drain feature and a second drain/drain feature,
      a first gate dielectric layer over the plurality of first channel members, and
      a metal gate stack over the first gate dielectric layer;
   a second GAA transistor comprising:
      a plurality of second channel members, and
      a second gate dielectric layer over the plurality of second channel members; and
   a first dielectric gate stack and a second dielectric gate stack,
   wherein a first width (W1) of each of the plurality of first channel members is greater than a second width (W2) of each of the plurality of second channel members,
   wherein a first thickness (GL1) of the first gate dielectric layer is smaller than a second thickness (GL2) of the second gate dielectric layer,
   wherein the first source/drain feature is disposed between the metal gate stack and the first dielectric gate stack,
   wherein the second source/drain feature is disposed between the metal gate stack and the second dielectric gate stack.

2. The semiconductor device of claim 1, wherein the first GAA transistor is for high drive current applications and the second GAA transistor is for low leakage applications.

3. The semiconductor device of claim 1, wherein a ratio of the first width (W1) to the second width (W2) is between about 1.2 and about 10.0.

4. The semiconductor device of claim 1, wherein a difference between the second thickness (GL2) and the first thickness (GL1) is between about 1 Å and about 10 Å.

5. The semiconductor device of claim 1, wherein the first width (W1) is between about 12 nm and about 30 nm and the second width (W2) is between about 4 nm and about 15 nm.

6. A semiconductor device, comprising:
a substrate comprising a first region and a second region;
a first n-type gate-all-around (GAA) transistor and a first p-type GAA transistor in the first region, wherein each of the first n-type GAA transistor and the first p-type GAA transistor comprises:
 a plurality of first channel members,
 a first gate dielectric layer over the plurality of first channel members, and
 a first common gate stack over and in direct contact with the first gate dielectric layer; and
a second n-type GAA transistor and a second p-type GAA transistor in the second region, wherein each of the second n-type GAA transistor and the second p-type GAA transistor comprises:
 a plurality of second channel members,
 a second gate dielectric layer over the plurality of second channel members, and
 a second common gate stack over and in direct contact with the second gate dielectric layer,
wherein a first width (W1) of each of the plurality of first channel members is greater than a second width (W2) of each of the plurality of second channel members,
wherein a first thickness (GL1) of the first gate dielectric layer is smaller than a second thickness (GL2) of the second gate dielectric layer.

7. The semiconductor device of claim 6, wherein the first region abuts the second region.

8. The semiconductor device of claim 6,
wherein the first region includes a first region height (C1) and the second region includes a second region height (C2),
wherein a ratio of the first region height (C1) to the second region height (C2) is between about 1.1 and about 2.0.

9. The semiconductor device of claim 6, wherein the first p-type GAA transistor in the first region and the second p-type GAA transistor in the second region are disposed over an n-type well.

10. The semiconductor device of claim 6, wherein the first region is for high drive current applications and the second region is for low leakage applications.

11. The semiconductor device of claim 6, wherein a ratio of the first width (W1) to the second width (W2) is between about 1.2 and about 10.0.

12. The semiconductor device of claim 6, wherein a difference between the second thickness (GL2) and the first thickness (GL1) is between about 1 Å and about 10 Å.

13. The semiconductor device of claim 6, wherein the first width (W1) is between about 12 nm and about 30 nm and the second width (W2) is between about 4 nm and about 15 nm.

14. The semiconductor device of claim 6, wherein the first common gate stack is isolated from the second common gate stack by at least one gate end dielectric feature.

15. A semiconductor device, comprising:
a substrate comprising a high drive current region and a low leakage region;
a first transistor in the high drive current region, the first transistor including:
 a plurality of first nanostructures stacked vertically from the substrate and extending between a first source/drain feature and a second drain/drain feature,
 a first gate dielectric layer over and around the plurality of first nanostructures, and
 a metal gate stack over the first gate dielectric layer;
a second transistor in the low leakage region, the second transistor including:
 a plurality of second nanostructures stacked vertically from the substrate, and
 a second gate dielectric layer over and around the plurality of second nanostructure; and
a first dielectric gate stack and a second dielectric gate stack,
wherein a first width (W1) of each of the plurality of first nanostructures is greater than a second width (W2) of each of the plurality of second nanostructures,
wherein a first thickness (GL1) of the first gate dielectric layer is smaller than a second thickness (GL2) of the second gate dielectric layer,
wherein the first source/drain feature is disposed between the metal gate stack and the first dielectric gate stack,
wherein the second source/drain feature is disposed between the metal gate stack and the second dielectric gate stack.

16. The semiconductor device of claim 15, wherein a ratio of the first width (W1) to the second width (W2) is between about 1.2 and about 10.0.

17. The semiconductor device of claim 15, wherein a difference between the second thickness (GL2) and the first thickness (GL1) is between about 1 Å and about 10 Å.

18. The semiconductor device of claim 15, wherein the first width (W1) is between about 12 nm and about 30 nm and the second width (W2) is between about 4 nm and about 15 nm.

19. The semiconductor device of claim 15, wherein a pitch of the plurality of first nanostructures is the same as a pitch of the plurality of second nanostructures.

20. The semiconductor device of claim 15, wherein a thickness of each of the plurality of first nanostructures is the same as a thickness of each of the plurality of second nanostructures.

* * * * *